(12) United States Patent  (10) Patent No.:  US 11,023,079 B2
Ni et al.  (45) Date of Patent:  Jun. 1, 2021

(54) INFRARED TOUCH DEVICE, TOUCH DETECTION METHOD AND TOUCH DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Huan Ni, Beijing (CN); Yuan Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 90 days.

(21) Appl. No.: 16/002,326

(22) Filed: Jun. 7, 2018

(65) Prior Publication Data

US 2019/0114031 A1  Apr. 18, 2019

(30) Foreign Application Priority Data

Oct. 18, 2017 (CN) .......................... 201710970902.1

(51) Int. Cl.
*G06F 3/042* (2006.01)
*G02B 5/28* (2006.01)
(Continued)

(52) U.S. Cl.
CPC ........... *G06F 3/0421* (2013.01); *G02B 5/281* (2013.01); *G02B 26/007* (2013.01);
(Continued)

(58) Field of Classification Search
CPC ....... G02B 26/007; G02B 5/281; G06F 3/042; G06F 3/0421; G06F 3/0412;
(Continued)

(56) References Cited

U.S. PATENT DOCUMENTS 7,385,594 B2    6/2008  Liao et al.
2010/0315360 A1*  12/2010  Lee ..................... G06F 3/042
                                                    345/173

(Continued)

FOREIGN PATENT DOCUMENTS

CN      104345995     2/2015
CN      104880842     9/2015
CN      107193416     9/2017

OTHER PUBLICATIONS

First Office Action for CN Application No. 201710970902.1, dated Dec. 17, 2019, 19 pages.

*Primary Examiner* — Kwang-Su Yang
(74) *Attorney, Agent, or Firm* — Dinsmore & Shohl LLP

(57) ABSTRACT

The embodiments of the present disclosure provide an infrared touch device, a touch detection method and a touch display device. An infrared touch device, comprising: an infrared emitter configured to emit infrared light; and a touch sensor configured to receive the infrared light, wherein the touch sensor changes an infrared light transmittance at a touch position when touched, and determines the touch position according to transmitted infrared light.

13 Claims, 5 Drawing Sheets

(51) Int. Cl.
  *G02F 1/1333* (2006.01)
  *G02F 1/1335* (2006.01)
  *H01L 27/32* (2006.01)
  *G02F 1/13357* (2006.01)
  *G02B 26/00* (2006.01)
  *G06F 3/041* (2006.01)

(52) U.S. Cl.
  CPC .... *G02F 1/13338* (2013.01); *G02F 1/133617* (2013.01); *G06F 3/042* (2013.01); *H01L 27/323* (2013.01); *G06F 3/0412* (2013.01); *G06F 2203/04103* (2013.01)

(58) Field of Classification Search
  CPC ....... G06F 2203/04103; G02F 1/13338; G02F 1/133617; G02F 2203/11; H01L 27/323
  See application file for complete search history.

(56) References Cited

U.S. PATENT DOCUMENTS

| | | | |
|---|---|---|---|
| 2011/0007047 A1* | 1/2011 | Fujioka | G02F 1/13338 345/207 |
| 2015/0029154 A1* | 1/2015 | Lee | G06F 3/0425 345/175 |
| 2016/0117013 A1* | 4/2016 | Xiao | G06F 3/0421 345/174 |
| 2016/0142651 A1* | 5/2016 | Shin | H04N 5/272 348/239 |
| 2019/0391307 A1* | 12/2019 | Wheatley | G02B 5/22 |

* cited by examiner

INFRARED TOUCH DEVICE, TOUCH DETECTION METHOD AND TOUCH DISPLAY DEVICE

CROSS-REFERENCE TO RELATED APPLICATION

This application claims priority to Chinese Patent Application No. 201710970902.1, filed on Oct. 18, 2017, which is hereby incorporated by reference in its entirety.

TECHNICAL FIELD

The present disclosure relates to touch technical field, and in particular to an infrared touch device and a touch display device.

BACKGROUND

Touch technology is an important link in the human-computer interaction process, and display devices such as smart phones and tablet computers all require support from the touch technology. Existing touch technology mainly includes capacitive, resistive, ultrasonic, and infrared technologies. Among them, since the capacitive and resistive touch technologies both have their optimum use environment, under abnormal circumstances such as strong electromagnetic interference, the use effect of the two touch technologies will be affected, resulting in misjudgment. In contrast, infrared touch technology has a high stability, which not only has strong resistance to external electromagnetic interference, but also has a long service life. Therefore, infrared touch technology has gradually been favored by people.

SUMMARY

An embodiment of the present disclosure provides an infrared touch device, comprising: an infrared emitter configured to emit infrared light; and a touch sensor configured to receive the infrared light, wherein the touch sensor changes an infrared light transmittance at a touch position when touched, and determines the touch position according to transmitted infrared light.

In some embodiments of the present disclosure, the touch sensor comprises: an interference filter layer configured to transmit the infrared light emitted by the infrared emitter, and generate a deformation at the touch position when touched, so as to change a transmittance of the infrared light at the touch position; and an infrared sensing layer disposed on a side of the interference filter layer away from the infrared emitter, for sensing the infrared light transmitted from the interference filter layer, and determining the touch position based on a sensed change in intensity of the transmitted infrared light.

In some embodiments of the present disclosure, the interference filter layer is a band-pass filter film.

In some embodiments of the present disclosure, the interference filter layer includes a plurality of first layers and a plurality of second layers, the first layers and the second layers are alternately disposed, each of the plurality of first layers and each of the plurality of second layers have a thickness of 3 μm to 5 μm, and the first layers have a refractive index greater than that of the second layers.

In some embodiments of the present disclosure, the interference filter layer comprises an interference filter film for long wave infrared and an interference filter film for short wave infrared.

In some embodiments of the present disclosure, the infrared sensing layer comprises: a plurality of first receivers extending in a first direction, a plurality of second receivers extending in a second direction which is not parallel to the first direction; and an insulating layer located between the first plurality of receivers and the second plurality of receivers so that the first plurality of receivers being insulated from the second plurality of receivers, wherein the plurality of first receivers and the plurality of second receivers are configured to receive the infrared light transmitted through the interference filter layer, and generate a current based on the received infrared light.

According to a further embodiment of the present disclosure, a touch detection method is provided. The method comprises: emitting an infrared light by an infrared emitter; receiving the infrared light by a touch sensor, wherein the touch sensor changes an infrared light transmittance at a touch position when touched; and determining the touch position according to the transmitted infrared light.

According to a still further embodiment of the present disclosure, a touch display device is provided which includes a display panel and the infrared touch device as described above.

In some embodiments of the present disclosure, the display panel is a liquid crystal display panel, and the infrared touch device is disposed on a light exit surface of the liquid crystal display panel, and a backlight of the liquid crystal display panel is used as the infrared emitter of the infrared touch device, and the backlight is provided with an infrared fluorescent powder.

In some embodiments of the present disclosure, the display panel is a liquid crystal display panel, the infrared touch device is disposed on a light exit surface of the liquid crystal display panel, and an infrared fluorescent layer is disposed on a color filter substrate of the liquid crystal display panel as the infrared emitter of the infrared touch device.

In some embodiments of the present disclosure, the display panel is a liquid crystal display panel comprising a color filter substrate and a black matrix, the infrared touch device is disposed on the color filter substrate of the liquid crystal display panel; a color filter base of the color filter substrate serves as a touch sensing layer of the infrared touch device, and the interference filter layer and the infrared sensing layer of the infrared touch device are disposed between the color filter base and the black matrix; and a backlight of the liquid crystal display panel is used as the infrared emitter of the infrared touch device, and the backlight is provided with an infrared fluorescent powder.

In some embodiments of the present disclosure, the display panel is a liquid crystal display panel comprising a color filter substrate and a black matrix, the infrared touch device is disposed on the color filter substrate of the liquid crystal display panel, a color filter base of the color filter substrate serves as a touch sensing layer of the infrared touch device, and the interference filter layer and the infrared sensing layer of the infrared touch device are disposed between the color filter base and the black matrix; and an infrared fluorescent layer is further disposed on the color filter substrate as the infrared emitter of the infrared touch device.

In some embodiments of the present disclosure, the display panel is an organic light emitting diode display panel, and the infrared touch device is disposed on a light exit surface of the organic light emitting diode display panel; the organic light emitting diode display panel includes a light emitting functional layer, and an infrared functional layer is disposed in the light emitting functional layer as the infrared emitter of the infrared touch device.

In some embodiments of the present disclosure, the display panel is an organic light emitting diode display panel, the infrared touch device is disposed on a package cover plate of the organic light emitting diode display panel; a package substrate of the package cover plate is used as a touch sensing layer of the infrared touch device, and the interference filter layer and the infrared sensing layer of the infrared touch device are disposed on the package substrate; the organic light emitting diode display panel includes a light emitting functional layer, and an infrared functional layer is disposed in the light emitting functional layer as the infrared emitter of the infrared touch device.

BRIEF DESCRIPTION OF THE DRAWINGS

The accompanying drawings are used to provide a further understanding of the technical solutions of the present disclosure and constitute a part of the specification, and are used together with the embodiments of the present application to explain the technical solutions of the present disclosure and do not constitute limitations on the technical solutions of the present disclosure. The shapes and sizes of the components in the accompanying drawings do not reflect true scales and are only intended to illustrate the present disclosure.

DETAILED DESCRIPTION

The specific implementations of the present disclosure will be further described in details below with reference to the accompanying drawings and embodiments. The following examples are used to illustrate the present disclosure but are not used to limit the scope of the present disclosure. It should be noted that, the embodiments in the present application and the features in the embodiments can be combined with each other arbitrarily in a condition without inconsistency.

An embodiment of the present disclosure provides an infrared touch device and a touch display device. By adopting a layered structure, a thickness of the infrared touch device is effectively reduced, and thinning is achieved, so that the infrared touch device can be disposed on a display panel to form an on-cell structure on the display panel, or embedded in the display panel to form an in-cell structure in the display panel. Meanwhile, since the infrared touch device determines a touch position by changing an infrared light transmittance of the touch position, multi-touch can be realized. The infrared touch device and the touch display device provided in the embodiment of the present disclosure effectively overcome the defects that existing infrared touch screens have a large thickness and cannot realize multi-touch. Meanwhile, the infrared touch device and the touch display device in the embodiment of the present disclosure have a strong anti-interference ability and can be applied to various application environments.

Of course, implementing any product or method of the present disclosure does not necessarily need to achieve all of the advantages described above at the same time. Other characteristics and advantages of the present disclosure will be described thereafter in the embodiments of the description, and will partially become obvious in the description, or be understood by implementing the present disclosure. The object and other advantages of the present disclosure may be realized and obtained by means of the structures indicated specifically in the description, claims, and accompanying drawings.

Figure 1:
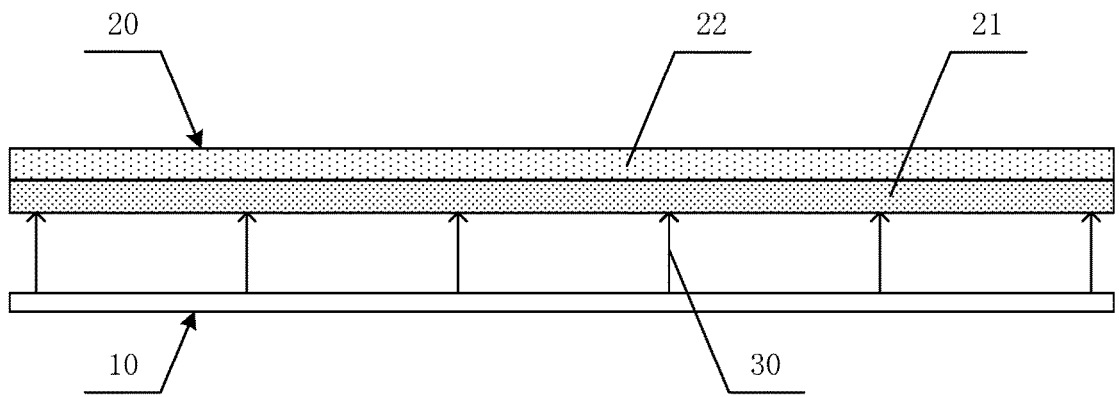
FIG. 1 is a schematic structural diagram of an infrared touch device of an embodiment of the present disclosure.

FIG. 1 is a schematic diagram of an infrared touch device of an embodiment of the present disclosure, and the direction of the arrow in the figure is a direction of an infrared light path. As shown in FIG. 1, a main structure of an infrared touch device includes an infrared emitter 10 and a touch sensor 20 of a layered structure. The infrared emitter 10 and the touch sensor 20 are oppositely disposed. The infrared emitter 10 is used to emit infrared light 30, and the touch sensor 20 is used to determine one or more touch positions by changing a transmittance of the infrared light when touched.

Wherein, the touch sensor 20 includes an interference filter layer 21 and an infrared sensing layer 22. The interference filter layer 21 is disposed opposite to the infrared emitter 10 for transmitting infrared light emitted by the infrared emitter 10, and producing a deformation at a touch position when touched to change a transmittance of the infrared light at the touch position. The infrared sensing layer 22 is disposed on a side of the interference filter layer 21 away from the infrared emitter 10 for receiving infrared light transmitted from the interference filter layer 21, and determining one or more touch positions based on a change in intensity of the transmitted infrared light.

Figure 12:
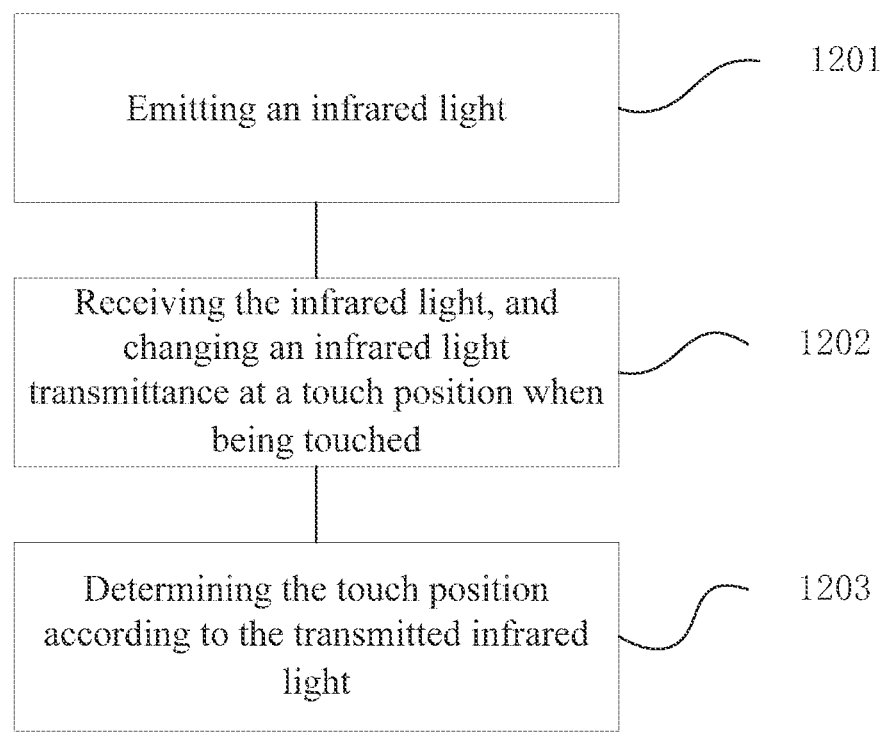
FIG. 12 shows a flow chart of a touch detection method according to an embodiment of the present disclosure.

FIG. 12 show a flow chart of a touch detection method according to an embodiment of the present disclosure. As shown in FIG. 12, a touch detection method includes emitting an infrared light by an infrared emitter (1201); receiving the infrared light by a touch sensor, wherein the touch sensor changes an infrared light transmittance at a touch position when being touched (1202); and determining the touch position according to the transmitted infrared light (1203). The detailed steps will be explained later.

Figure 2:
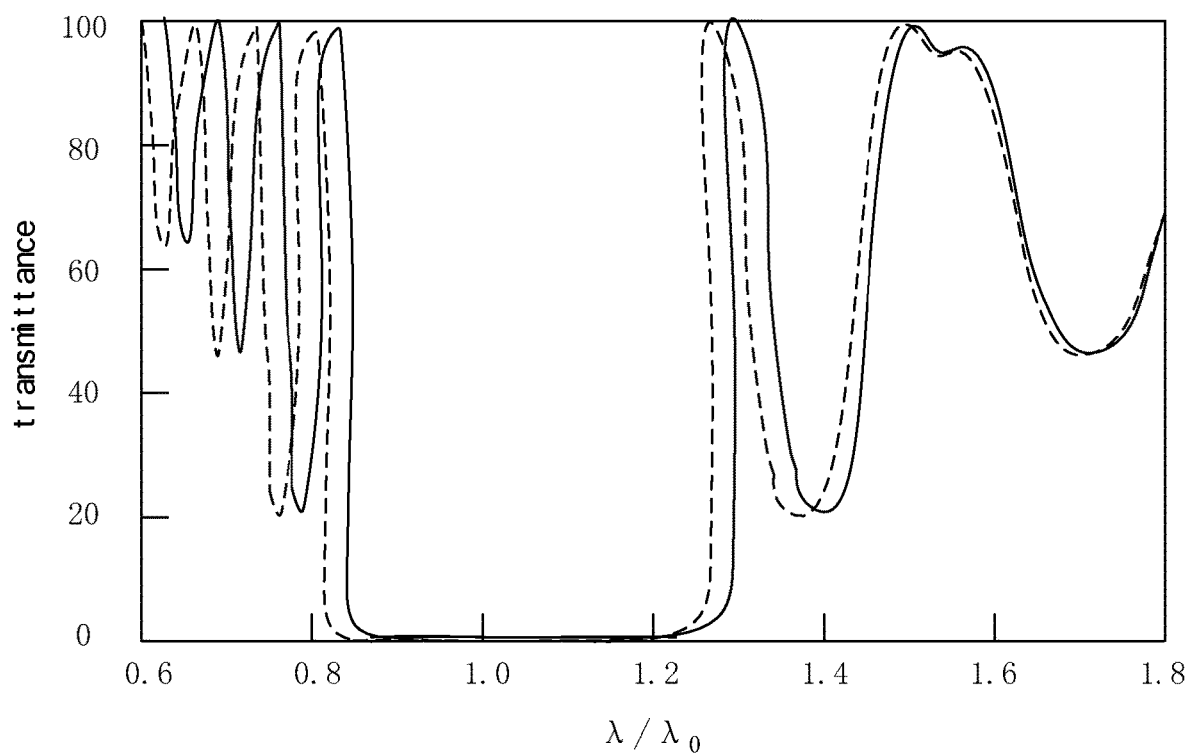
FIG. 2 is a change curve of a transmittance and an incident angle of an interference filter film.

The working principle of the infrared touch device in the embodiment of the present disclosure is that by deforming the touch position when touched, an infrared light transmittance of the interference filter layer is changed, which in turn changes an intensity of the infrared light transmitted through the interference filter, and the infrared sensing layer determines a touch position through detecting a change in intensity of the transmitted infrared light. In general, light is incident on a surface of an optical device to be reflected and refracted. Different optical devices may have different reflectivity and transmittance. A transparent dielectric thin film or a metal thin film may be manufactured on the surface of the optical device by a coating method to form an optical thin film. A multi-beam interference effect of the optical thin film is used to change an intensity distribution of reflection and transmission, increase or decrease the reflectivity or transmittance, and adjust a phase of the light. According to the functional characteristics, the optical thin film can be summarized as an enhancement film, a reflection film, a filter film, a spectroscopic film, a polarizing film, a protective film, etc. The filter film (also called an interference filter film) is an optical thin film that passes light in a specific spectral range using the interference principle, which is mainly classified into a band-pass filter film that passes light in a specific wavelength band and a density filter film that reduces light intensity. Wherein, the band-pass filter film (e.g., Fabry-Perot interference filter film) is consisted of a multilayer film. FIG. 2 is a change curve of a transmittance and an incident angle of an interference filter film. The solid line in the figure is a transmittance curve when the interference filter film is vertically incident, and the dotted line is a transmittance curve when the incident angle is 20 degrees. As shown in FIG. 2, when the incident light deviates from the vertical direction into the interference filter film, an operating wavelength λ, will deviate from the center wavelength λ0. As the incident angle increases, the operating wavelength shifts to the short wave direction, which is caused by a change in the optical path that affects the interference of light waves. As the incident angle increases, the transmittance curve shifts and the incident light transmittance decreases.

The embodiment of the present disclosure utilizes this characteristic of the band-pass filter film to determine a touch position by detecting a change in intensity of the infrared light transmitted through the interference filter layer. Specifically, when the infrared touch device is not touched, infrared light emitted by the infrared emitter is vertically incident on the interference filter layer, and the interference filter layer has a normal transmittance. When a finger touches the infrared touch device, the touch position is deformed when pressed, resulting in a deformation of the interference filter layer. Therefore, at the touch position, an incident angle of the infrared light emitted from the infrared emitter into the interference filter layer changes. As a result, a transmittance of the interference filter layer at the touch position decreases, and the transmittance is less than the normal transmittance. The transmittance at the touch position decreases, so that an intensity of infrared light transmitted through the interference filter layer decreases. When the infrared sensing layer detects that the intensity of the infrared light transmitted through the interference filter layer changes, it can be determined that a position where the intensity of the infrared light changes is the touch position.

An embodiment of the present disclosure provides an infrared touch device. Since the infrared touch devices adopts a layered structure, a thickness of the infrared touch device is effectively reduced, and thinning is achieved, so that the infrared touch device can be disposed on a display panel to form an on-cell structure on the display panel, or embedded in the display panel to form an in-cell structure in the display panel. Meanwhile, since the infrared touch device determines a touch position by changing an infrared light transmittance of the touch position, multi-touch can be realized. The infrared touch device provided in the embodiment of the present disclosure effectively overcomes the defects that existing infrared touch screens have a large thickness and cannot realize multi-touch. Meanwhile, the infrared touch device in the embodiment of the present disclosure has a strong anti-interference ability and can be applied to various application environments.

The technical solutions of the embodiments of the present disclosure are described in details below by using specific embodiments.

Figure 3:
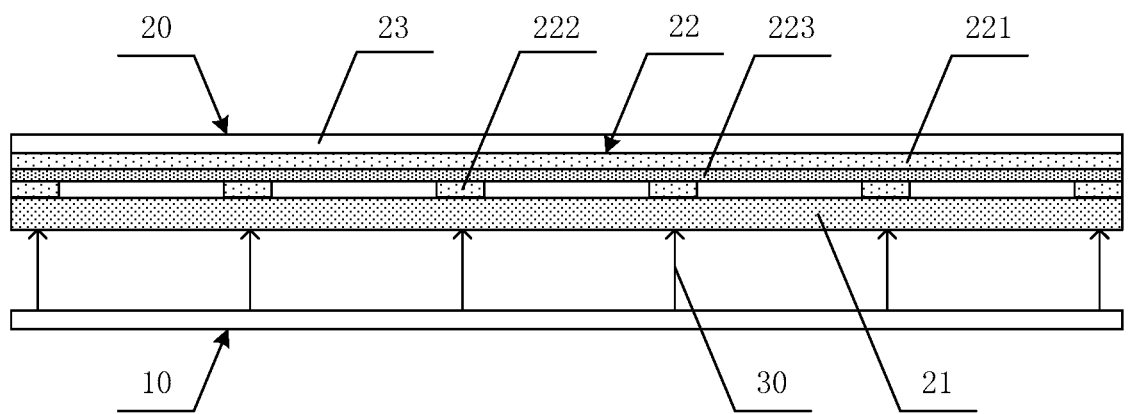
FIG. 3 is a schematic structural diagram of an infrared touch device of an embodiment of the present disclosure.
Figure 4:
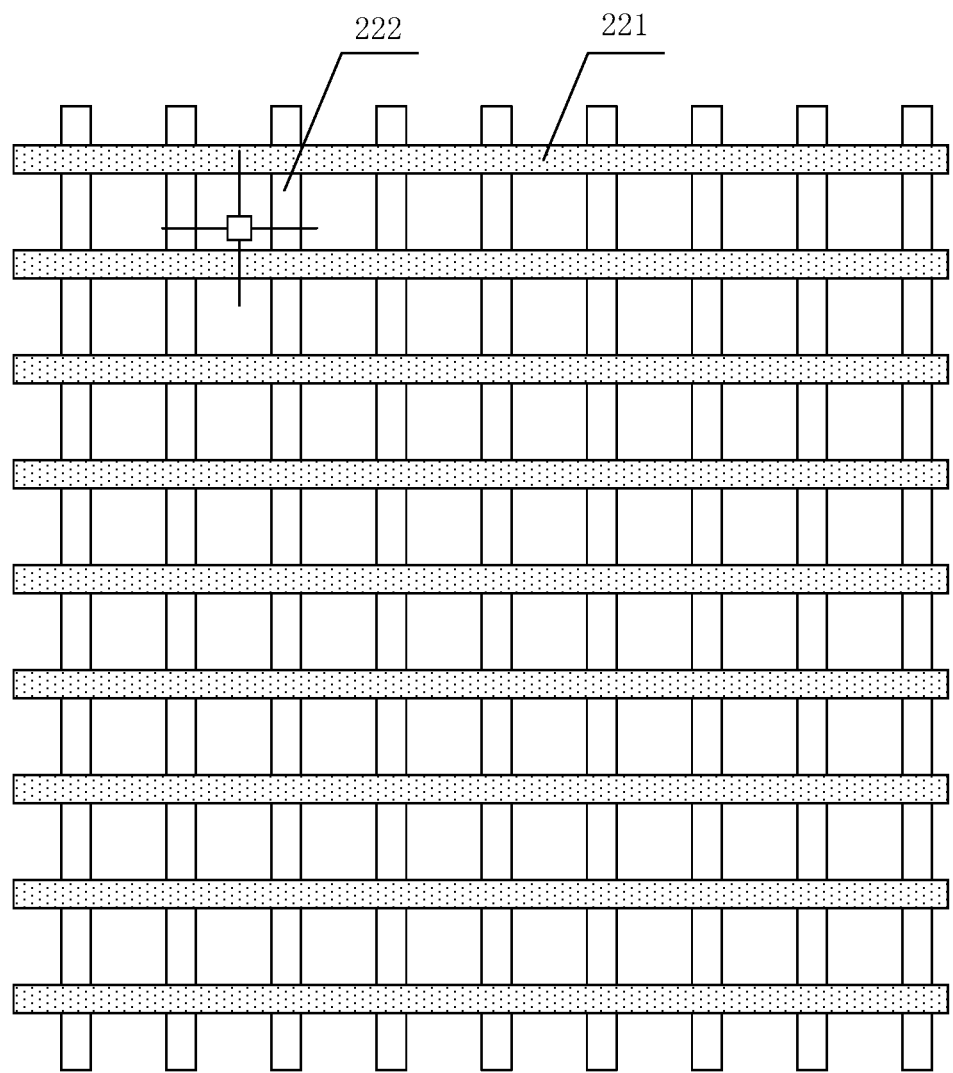
FIG. 4 is a plan view of a structure of FIG. 3.

FIG. 3 is a schematic structural diagram of an infrared touch device of an embodiment of the present disclosure, and FIG. 4 is a plan view of the structure of FIG. 3. The infrared touch device in this embodiment can be used as an independent infrared touch panel. As shown in FIGS. 3 and 4, a main structure of the infrared touch device in the present embodiment includes an infrared emitter 10 and a touch sensor 20 of a layered structure. The infrared emitter 10 and the touch sensor 20 are oppositely disposed. The infrared emitter 10 is used to emit infrared light 30, and the touch sensor 20 is used to determine a touch position by changing a transmittance of the infrared light when touched. The touch sensor 20 of the present embodiment includes an interference filter layer 21, an infrared sensing layer 22 and a touch sensing layer 23. The interference filter layer 21 is disposed opposite to the infrared emitter 10 for transmitting infrared light emitted by the infrared emitter 10, and changing a transmittance of the infrared light when a deformation occurs at the touch position. The infrared sensing layer 22 is disposed on a surface of a side of the interference filter layer 21 away from the infrared emitter 10 for receiving infrared light transmitted from the interference filter layer 21, and determining one or more touch positions based on a change in intensity of the transmitted infrared light. The touch sensing layer 23 is disposed on a surface of a side of the infrared sensing layer 22 away from the infrared emitter 10 for sensing touch and producing a deformation at the touch position. Or, the infrared sensing layer 22 is disposed on a surface of the touch sensing layer 23 facing the infrared emitter 10, and the interference filter layer 21 is disposed on a surface of the infrared sensing layer 22 facing the infrared emitter 10. The touch sensing layer 23, the infrared sensing layer 22 and the interference filter layer 21 form a layered overall structure, so that infrared light emitted by the infrared emitter 10 is sequentially incident on the interference filter layer 21, the infrared sensing layer 22, and the touch sensing layer 23.

In this embodiment, the infrared sensing layer 22 includes a plurality of first receivers 221 and a plurality of second receivers 222. The first receivers 221 and the second receivers 222 are all in a strip structure, and the first receivers 221 and the second receivers 222 are arranged in cross-insulation. In some embodiments according to the present disclosure, the plurality of first receivers 221 extend in a first direction, and the plurality of second receivers 222 extend in a second direction, the first direction is not parallel to the second direction. The plurality of first receivers 221 are located in the same layer and are arranged parallel to each other with an interval, and the plurality of second receivers 222 are located in the same layer and are arranged parallel to each other with an interval. An insulating layer 223 is provided between the first receivers 221 and the second receivers 222, so that the first receivers 221 and the second receivers 222 are insulated from each other. The plurality of first receivers 221 and the plurality of second receivers 222 receive infrared light transmitted through the interference filter layer 21 and photoelectrically convert the received infrared light to form a current. The intensity of the received infrared light is different, and the magnitude of the formed current is different. The operating principle of the infrared sensing layer in this embodiment is that a plurality of first receivers 221 and a plurality of second receivers 222 are both connected to a peripheral touch circuit (not shown), and the touch circuit respectively scans the plurality of first receiver 221 and the plurality of second receivers 222 in a preset frequency to collect currents of the first receivers 221 and the second receivers 222. When the collected currents change, it is determined that a touch action occurs at corresponding positions of the first receivers 221 and the second receivers 222 where the currents change, and one or more touch positions are determined according to the positions of the first receivers 221 and the second receivers 222.

In this embodiment, the interference filter layer 21 adopts an interference filter film for long wave infrared, which is an overall planar structure and can transmit visible light and infrared light at the same time. When combined with the display panel to be a touch display device, the planar interference filter film completely covers the entire display panel. In the present embodiment, the interference filter layer 21 may adopt a periodic structure in which a plurality of first layers and a plurality of second layers are alternately stacked. A refractive index of the first layers is greater than that of the second layers, and each first layer and each second layer have a thickness of 3 μm~5 μm and a number of cycles of 2~8. In practical implementation, the first layers may be germanium Ge or lead telluride GePbTe to form high refractive index layers, and the second layers may be zinc sulfide ZnS or zinc selenide ZnSe to form low refractive index layers. When a finger touches the touch sensing layer 23, the touch sensing layer 23 in the touch position is deformed when pressed. Since the touch sensing layer 23, the infrared sensing layer 22, and the interference filter layer 21 are of an overall structure, as a result, the interference filter layer 21 is also deformed. In the touch position where the deformation occurs, an angle at which light of the infrared emitter 10 is incident on the interference filter layer 21 changes from a vertical direction to a non-vertical direction, and the transmittance curve shifts to the short wave direction, resulting in a decrease of the transmittance of the interference filter layer 21 at the touch position, and a decrease of an intensity of the infrared light transmitted through the interference filter layer 21. Infrared light transmitted through the interference filter layer 21 is received by the first receivers 221 and the second receivers 222 and is converted into a current. The touch control circuit collects this current and determines whether the current is less than a preset threshold. When the collected current is less than the preset threshold, it is determined that there is a touch action, and the touch position can be determined according to the positions of the first receivers 221 and the second receivers 222.

In this embodiment, the infrared emitter may be a separate infrared light source, or the visible light of the display panel may be used to convert visible light into infrared light. The touch sensing layer can use a flexible substrate such as plastic or polymer, so as to be deformed at the touch position when pressed.

Figure 5:
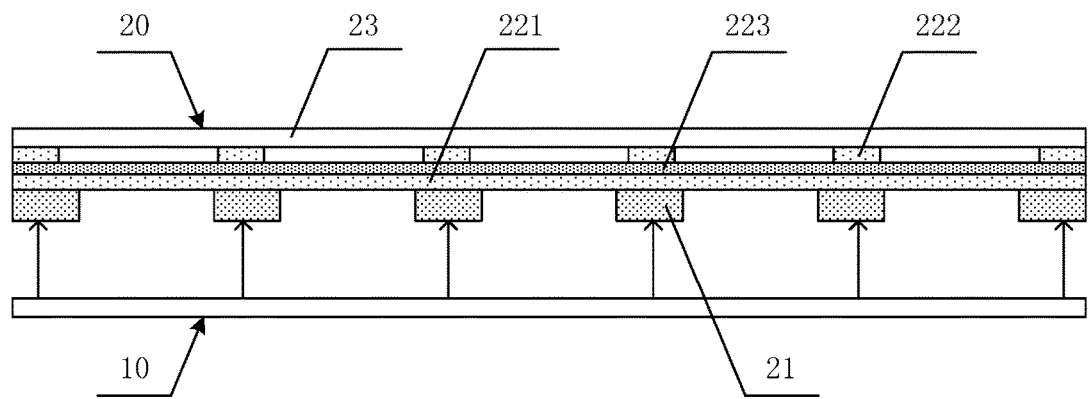
FIG. 5 is a schematic structural diagram of an infrared touch device of an embodiment of the present disclosure.

FIG. 5 is a schematic structural diagram of an infrared touch device of an embodiment of the present disclosure. As shown in FIG. 5, the main structure of the infrared touch device in this embodiment is substantially the same as that of the first embodiment described above. The difference is that the interference filter layer 21 of the present embodiment uses an interference filter film for short wave infrared, and only transmits infrared light. The interference filter film for short wave infrared may include a plurality of strip structures, and the plurality of strip structures are parallel and spaced from each other. When combined with the display panel to be a touch display device, the position of each strip structure corresponds to an opaque region of the display panel. That is, the interference filter layer 21 in the present embodiment covers only the opaque region of the display panel. In this embodiment, by setting the interference filter layer into a stripe structure, an influence of the interference filter layer on the transmittance of the display panel can be minimized. In practical implementation, the interference filter layer of the present embodiment may also be configured as a mesh structure similar to the touch sensing layer, or may be configured as a lattice structure. Further, the infrared emitter may also be configured as a mesh structure similar to the infrared sensing layer, or may be configured as a lattice structure, as long as the infrared emitting structure corresponds to the interference filter structure.

Figure 6:
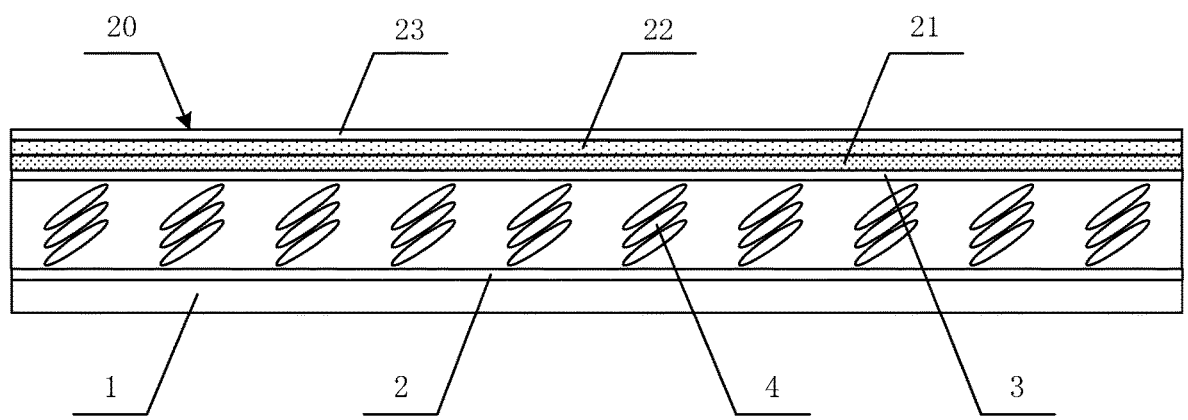
FIG. 6 is a schematic structural diagram of an infrared touch device of an embodiment of the present disclosure.

FIG. 6 is a schematic structural diagram of an infrared touch device of an embodiment of the present disclosure. In this embodiment, the infrared touch device is a touch display device that is combined with a liquid crystal display (LCD) panel to form an on-cell structure. As shown in FIG. 6, the touch display device of this embodiment includes an LCD panel and a touch sensor disposed on a light exit surface of the LCD panel. The main structure of the LCD panel includes a backlight 1, an array (thin film transistor, TFT) substrate 2 and a color filter (CF) substrate 3, and a liquid crystal (LC) layer 4 is arranged between the ARRAY substrate 2 and the color filter substrate 3, and the backlight 1 is arranged on a side of the ARRAY substrate 2. The touch sensor 20 of this embodiment includes an interference filter layer 21, an infrared sensing layer 22, and a touch sensing layer 23. The interference filter layer 21 is disposed on an outer surface of a side of the color filter substrate 3 away from the ARRAY substrate 2, the infrared sensing layer 22 is disposed on the interference filter layer 21, and the touch sensing layer 23 is disposed on the infrared sensing layer 22.

In this embodiment, the infrared emitter emitting infrared light may have various structural forms. For example, the backlight of the LCD panel is used as an infrared emitter, and the existing backlight is provided with an infrared fluorescent powder, for example, an addition of an infrared fluorescent powder to the fluorescent powder of the backlight can make the backlight emit infrared light. For another example, an infrared fluorescent layer is disposed in the film layer structure of the color filter substrate as an infrared emitter, and visible light emitted by the backlight is converted into infrared light. For another example, an infrared fluorescent layer is disposed between the outer surface of the color filter substrate and the interference filter layer as an infrared emitter, etc., which is not specifically limited in the present disclosure.

Although the present embodiment is described by using that an infrared touch control device and an LCD panel constitute a touch display device, the present embodiment is also applicable to a touch display device that is combined with an organic light emitting diode (OLED) display panel to form an on-cell structure. In this case, the touch sensor is disposed on a surface at the light exit side of the OLED panel, and the infrared emitter emitting infrared light may adopt a structure in which an infrared functional layer is disposed in a light emitting functional layer of the OLED panel.

Figure 7:
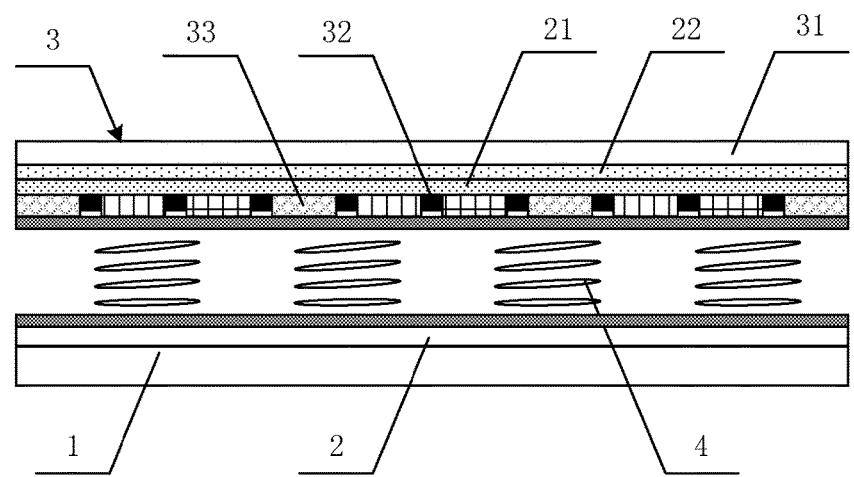
FIG. 7 is a schematic structural diagram of an infrared touch device of an embodiment of the present disclosure.

FIG. 7 is a schematic structural diagram of an infrared touch device of an embodiment of the present disclosure. In this embodiment, the infrared touch device is a touch display device that is combined with a liquid crystal display (LCD) panel to form an in-cell structure. As shown in FIG. 7, the touch display device of this embodiment includes an LCD panel and a touch sensor disposed in the LCD panel. The main structure of the LCD panel includes a backlight 1, a ARRAY substrate 2 and a color filter substrate 3, and a liquid crystal layer 4 is arranged between the ARRAY substrate 2 and the color filter substrate 3, and the backlight 1 is arranged on a side of the ARRAY substrate 2. Different from the third embodiment described above, the touch sensor of the infrared touch device in this embodiment is disposed on a surface of the color filter substrate of the LCD panel facing the ARRAY substrate. In this embodiment, the structure of the color filter substrate 3 includes a color filter base 31, and an infrared sensing layer 22, an interference filter layer 21, a black matrix 32, and a color filter layer 33 sequentially disposed on the color filter base 31. In this embodiment, the color filter base 31 serves as both a base of the color filter substrate and a touch sensing layer of the infrared touch device for sensing a touch and generating a deformation at the touch position. The backlight of the LCD panel serves as an infrared emitter that emits infrared light. The addition of an infrared fluorescent powder to the fluorescent powder of the existing backlight can make the backlight emit infrared light. The roles of the interference filter layer 21 and the infrared sensing layer 22 are the same as those in the foregoing embodiments, which will not be repeated here.

The technical solution of the present embodiment is further described below through a preparation process of the color filter substrate. Wherein, the "patterning process" mentioned in this embodiment includes processes such as depositing a film layer, coating a photoresist, exposing a mask, developing, etching, stripping a photoresist, and the like, and is an existing mature preparation process. The deposition may adopt known processes such as sputtering, vapor deposition, chemical vapor deposition, etc., the coating may adopt a known coating process, and the etching may adopt a known method, which are not specifically limited herein.

Figure 8:
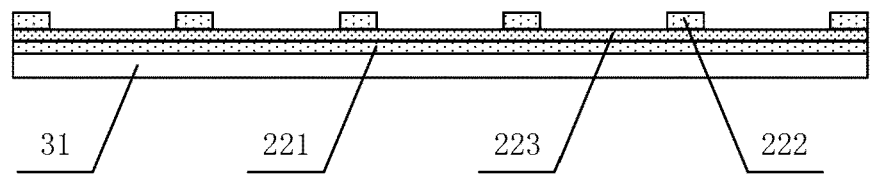
FIG. 8 is a schematic diagram of an embodiment of the present disclosure after an infrared sensing layer is formed.

First, a layer of conductive thin film is deposited on the color filter base 31, a layer of photoresist is coated on the conductive thin film, and the photoresist is exposed and developed by using a single-tone mask. An unexposed region is formed at a first receiver pattern position, a photoresist is left, a fully exposed region is formed at other positions, and the photoresist is removed. A conductive thin film of the fully exposed region is etched, and the remaining photoresist is stripped to form a first receiver 221 pattern. A layer of insulating layer 223 is deposited on the color filter base on which the first receiver pattern is formed. First, a layer of conductive thin film is deposited on the insulating layer, a layer of photoresist is coated on the conductive thin film, and the photoresist is exposed and developed by using a single-tone mask. An unexposed region is formed at a second receiver pattern position, a photoresist is left, a fully exposed region is formed at other positions, and the photoresist is removed. A conductive thin film of the fully exposed region is etched, and the remaining photoresist is stripped to form a second receiver 222 pattern, as shown in FIG. 8. The first receiver 221, the insulating layer 223, and the second receiver 222 constitute an infrared sensing layer. Wherein, the conductive thin film may be made of molybdenum Mo, aluminum Al, copper Cu or other conductive materials, and indium tin oxide ITO or indium zinc oxide IZO may also be used, and the insulating layer may be made of silicon oxide $SiO_2$, silicon oxynitride SiON, silicon nitride SiN or a combination thereof etc.

Figure 9:
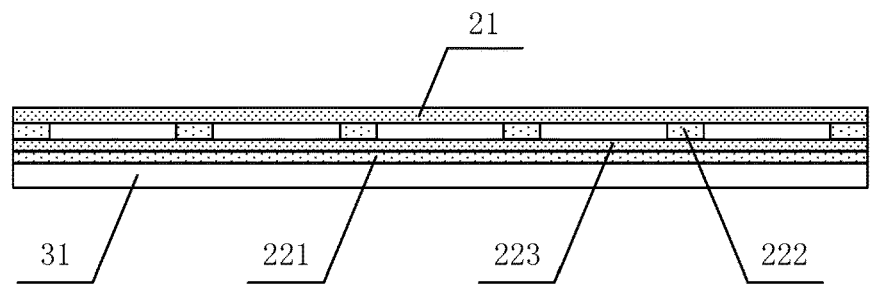
FIG. 9 is a schematic diagram of an embodiment of the present disclosure after an interference filter layer is formed.

Subsequently, an interference filter layer 21 is formed on the color filter base 31 on which the above pattern is formed. Forming the interference filter layer 21 may employ a deposition process to periodically deposit a high refractive index layer and a low refractive index layer, as shown in FIG. 9. When an interference filter layer is formed, thicknesses of the high refractive index layer and the low refractive index layer can be controlled by a deposition rate, and a thickness gauge can also be used to control the thicknesses of the high refractive index layer and the low refractive index layer. In practical implementation, an interference filter thin film may also be separately prepared, and the interference filter thin film may be attached to the color filter base when preparing a color filter substrate.

Figure 10:
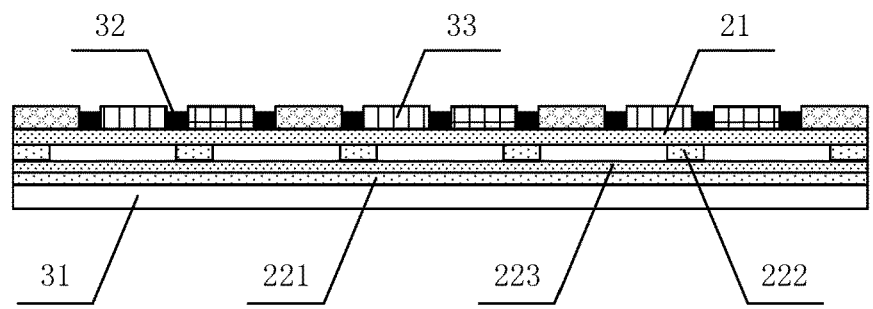
FIG. 10 is a schematic diagram of an embodiment of the present disclosure after a black matrix and a color filter layer are formed.

Subsequently, a black matrix thin film is coated on the color filter base 31 on which the above pattern is formed, and the black matrix thin film is exposed and developed using a mask. A black matrix 32 pattern is formed on the color filter base 31, and the black matrix is disposed at intervals. Next, a color filter layer 33 pattern is formed on the color filter base 31 on which the black matrix 32 pattern is formed. The color filter layer 33 pattern includes a red (R) photoresist pattern, a green (G) photoresist pattern, and a blue (B) photoresist pattern. The red, green and blue photoresists are respectively arranged between the black matrices 32 and are arranged according to a set rule, as shown in FIG. 10.

Although the present embodiment has been described with an interference filter layer of a planar structure, the present embodiment is also applicable to an interference filter film of a stripe structure. For an interference filter film of a strip structure, the interference filter film pattern is the same with the black matrix pattern, and the positions of the two correspond to each other, that is, an orthographic projection of the interference filter film pattern on the color filter base and an orthographic projection of the black matrix pattern on the color filter base overlap. Although the present embodiment is described with the touch sensor being disposed between the color filter base and the black matrix, in practical implementation, the touch sensor may be disposed between any film layers of the color filter substrate, and the infrared sensing layer and the interference filter layer may separate from each other, which are not specifically limited in this embodiment. In addition, the color filter substrate may further include a planarization layer (over coat, OC) and an alignment layer.

Although the present embodiment is described by using that an infrared touch control device and an LCD panel constitute a touch display device, the present embodiment is also applicable to a touch display device that is combined with an OLED panel to form an in-cell structure. In this case, the touch sensor is disposed on a package cover plate of the OLED panel. A package substrate of the package cover plate serves as both a package substrate and a touch sensing layer of the infrared touch device for sensing a touch and producing deformation at the touch position. The interference filter layer and the infrared sensing layer are provided on a surface of the package substrate facing a light emitting functional layer. The infrared emitter emitting infrared light may adopt a structure in which an infrared functional layer is disposed in a light emitting functional layer of the OLED panel.

Figure 11:
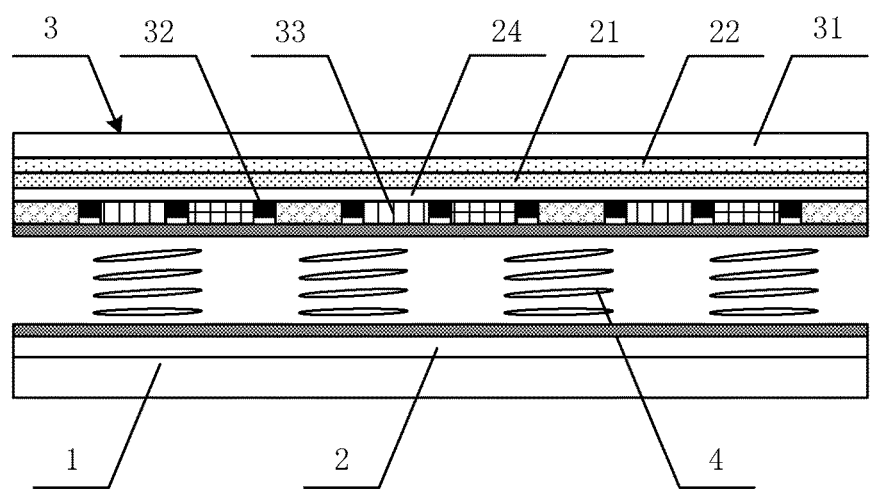
FIG. 11 is a schematic structural diagram of an infrared touch device of an embodiment of the present disclosure

FIG. 11 is a schematic structural diagram of an infrared touch device of an embodiment of the present disclosure. In this embodiment, the infrared touch device is a touch display device that is combined with a liquid crystal display panel to form an in-cell structure. As shown in FIG. 11, this embodiment is an extension of the fourth embodiment described above, and a main structure thereof is the same as that of the fourth embodiment. The difference is that in the present embodiment both the infrared emitter and the touch sensor of the infrared touch device are disposed on a surface of a side of the color filter substrate of the LCD panel facing the ARRAY substrate. In the present embodiment, the structure of the color filter substrate 3 includes a color filter base 31, and an infrared sensing layer 22, an interference filter layer 21, an infrared fluorescent layer 24, a black matrix 32, and a color filter layer 33 sequentially disposed on the color filter base 31. In this embodiment, the color filter base 31 serves as both a base of the color filter substrate and a touch sensing layer of the infrared touch device for sensing a touch and generating a deformation at the touch position. The infrared fluorescent layer 24 serves as an infrared emitter of the infrared touch device and converts visible light emitted from the backlight into infrared light. The roles of the interference filter layer 21 and the infrared sensing layer 22 are the same as those in the foregoing embodiments.

In this embodiment, an infrared fluorescent layer can be prepared by adding infrared fluorescent powder to the substrate in a coating method. In practical implementation, an infrared fluorescent layer may also be prepared by using existing film layers of the color filter substrate, such as adding infrared fluorescent powder in a planarization layer to form an infrared fluorescent layer, which is used as both a planarization layer of the color filter substrate and an infrared emitter of the infrared touch device.

Similarly, this embodiment is also applicable to a touch display device combined with an OLED panel into an in-cell structure, and also applicable to an interference filter film of a strip structure. The touch sensor may also be disposed between other film layers of the color filter substrate.

In the descriptions of the embodiments of the present disclosure, it is to be understood that the orientations or positional relationships indicated by the terms "middle", "upper", "lower", "front", "rear", "vertical", "horizontal", "top", "bottom", "inner", "outer" and so on are orientations or positional relationships shown in the accompanying drawings, and are merely for the convenience of describing the present disclosure and simplifying the descriptions, but do not indicate or imply that the indicated devices or elements must have a particular orientation and are constructed and operated in a particular orientation, and therefore should not be construed to be limitations of the present disclosure.

In the descriptions of the embodiments of the present disclosure, the terms "mount" and "connect" shall be understood in a broad sense unless specifically defined and limited otherwise. For example, they may be fixed connections or detachable connections, or integral connections; and they can be mechanical connections or electrical connections; they can be directly connected or indirectly connected through an intermediary, and can be internal communication of two components. Those ordinary skilled in the art can understand the specific meanings of the above terms in the present disclosure according to specific circumstances.

Although the disclosed embodiments of the present disclosure are as above, the contents described are merely implementations used for facilitating the understanding of the present disclosure and are not intended to limit the present disclosure. Any person skilled in the art to which the present disclosure pertains may make any modification and change in the form and details of implementation without departing from the spirit and scope disclosed in the present disclosure. However, the scope of patent protection of the present disclosure must still be based on the scope defined in the appended claims.

What is claimed is:

1. An infrared touch device, comprising:
   an infrared emitter configured to emit infrared light; and
   a touch sensor configured to receive the infrared light, wherein the touch sensor changes an infrared light transmittance at a touch position when touched, and determines the touch position according to transmitted infrared light,
   wherein the touch sensor comprises:
   an interference filter layer configured to transmit both the infrared light emitted by the infrared emitter and visible light, wherein the interference filter layer has a normal transmittance when not touched, and generate a deformation at the touch position when touched, so as to change a transmittance of the infrared light at the touch position; and
   an infrared sensing layer disposed on a side of the interference filter layer away from the infrared emitter, for sensing the infrared light transmitted from the interference filter layer, and determining the touch position based on a sensed change in intensity of the transmitted infrared light.

2. The infrared touch device according to claim 1, wherein the interference filter layer is a band-pass filter film.

3. The infrared touch device according to claim 2, wherein the interference filter layer includes a plurality of first layers and a plurality of second layers, the plurality of first layers and the plurality of second layers are alternately disposed, each of the plurality of first layers and each of the plurality of second layers have a thickness of 3 µm to 5 µm, and the plurality of first layers have a refractive index greater than that of the plurality of second layers.

4. The infrared touch device according to claim 2, wherein the interference filter layer comprises an interference filter film for long wave infrared and an interference filter film for short wave infrared.

5. The infrared touch device according to claim 1, wherein the infrared sensing layer comprises:
   a plurality of first receivers extending in a first direction,
   a plurality of second receivers extending in a second direction which is not parallel to the first direction; and
   an insulating layer located between the plurality of first receivers and the plurality of second receivers such that the plurality of first receivers are insulated from the plurality of second receivers,
   wherein the plurality of first receivers and the plurality of second receivers are configured to receive the infrared light transmitted through the interference filter layer, and generate a current based on the received infrared light.

6. A touch display device, including a display panel and the infrared touch device according to claim 1.

7. The touch display device according to claim 6, wherein: the display panel is a liquid crystal display panel, and the infrared touch device is disposed on a light exit surface of the liquid crystal display panel; and
   a backlight of the liquid crystal display panel is used as the infrared emitter of the infrared touch device, and the backlight is provided with an infrared fluorescent powder.

8. The touch display device according to claim 6, wherein: the display panel is a liquid crystal display panel, and the infrared touch device is disposed on a light exit surface of the liquid crystal display panel; and
   an infrared fluorescent layer is disposed on a color filter substrate of the liquid crystal display panel as the infrared emitter of the infrared touch device.

9. The touch display device according to claim 6, wherein: the display panel is a liquid crystal display panel comprising a color filter substrate and a black matrix, the infrared touch device is disposed on the color filter substrate of the liquid crystal display panel; a color filter base of the color filter substrate serves as a touch sensing layer of the infrared touch device, and an interference filter layer and an infrared sensing layer of the infrared touch device are disposed between the color filter base and the black matrix; and
    a backlight of the liquid crystal display panel is used as the infrared emitter of the infrared touch device, and the backlight is provided with an infrared fluorescent powder.

10. The touch display device according to claim 6, wherein: the display panel is a liquid crystal display panel comprising a color filter substrate and a black matrix, the infrared touch device is disposed on the color filter substrate of the liquid crystal display panel; a color filter base of the color filter substrate serves as a touch sensing layer of the infrared touch device, and an interference filter layer and an infrared sensing layer of the infrared touch device are disposed between the color filter base and the black matrix; and
    an infrared fluorescent layer is further disposed on the color filter substrate as the infrared emitter of the infrared touch device.

11. The touch display device according to claim 6, wherein: the display panel is an organic light emitting diode display panel, and the infrared touch device is disposed on a light exit surface of the organic light emitting diode display panel; and
    the organic light emitting diode display panel includes a light emitting functional layer, and an infrared functional layer is disposed in the light emitting functional layer as the infrared emitter of the infrared touch device.

12. The touch display device according to claim 6, wherein: the display panel is an organic light emitting diode display panel, the infrared touch device is disposed on a package cover plate of the organic light emitting diode display panel; a package substrate of the package cover plate is used as a touch sensing layer of the infrared touch device, and an interference filter layer and an infrared sensing layer of the infrared touch device are disposed on the package substrate; and
    the organic light emitting diode display panel includes a light emitting functional layer, and an infrared functional layer is disposed in the light emitting functional layer as the infrared emitter of the infrared touch device.

13. A touch detection method, comprising:
emitting an infrared light by an infrared emitter;
receiving the infrared light by a touch sensor, wherein the touch sensor changes an infrared light transmittance at a touch position when being touched; and
determining the touch position according to transmitted infrared light,
wherein the touch sensor comprises:
an interference filter layer configured to transmit both the infrared light emitted by the infrared emitter and visible light, wherein the interference filter layer has a normal transmittance when not touched, and generate a deformation at the touch position when touched, so as to change a transmittance of the infrared light at the touch position; and
an infrared sensing layer disposed on a side of the interference filter layer away from the infrared emitter, for sensing the infrared light transmitted from the interference filter layer, and determining the touch position based on a sensed change in intensity of the transmitted infrared light.

* * * * *